United States Patent
Koemtzopoulos et al.

(10) Patent No.: US 7,682,985 B2
(45) Date of Patent: Mar. 23, 2010

(54) DUAL DOPED POLYSILICON AND SILICON GERMANIUM ETCH

(75) Inventors: C. Robert Koemtzopoulos, Castro Valley, CA (US); Yoko Yamaguchi Adams, Fremont, CA (US); Yoshinori Miyamoto, Sagamihara (JP); Yousun Kim Taylor, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 1387 days.

(21) Appl. No.: 10/803,342

(22) Filed: Mar. 17, 2004

(65) Prior Publication Data
US 2005/0205862 A1 Sep. 22, 2005

(51) Int. Cl.
*H01L 21/302* (2006.01)
(52) U.S. Cl. .................. 438/719; 438/734; 438/735; 438/737; 216/49; 216/67; 216/79
(58) Field of Classification Search .................. 216/79
See application file for complete search history.

(56) References Cited

U.S. PATENT DOCUMENTS

| | | | | |
|---|---|---|---|---|
| 4,992,134 A * | 2/1991 | Gupta et al. | ............... | 438/714 |
| 5,269,879 A | 12/1993 | Rhoades et al. | ............. | 156/643 |
| 5,658,425 A | 8/1997 | Halman et al. | ............. | 438/620 |
| 5,846,443 A | 12/1998 | Abraham | ............... | 216/77 |
| 5,908,320 A | 6/1999 | Chu et al. | ............... | 438/743 |
| 6,004,884 A | 12/1999 | Abraham | ............... | 438/714 |
| 6,013,582 A | 1/2000 | Ionov et al. | ............... | 438/738 |
| 6,232,159 B1 | 5/2001 | Uda | ............... | 438/172 |
| 6,291,356 B1 | 9/2001 | Ionov et al. | ............... | 438/710 |
| 6,451,647 B1 * | 9/2002 | Yang et al. | ............... | 438/240 |
| 6,479,392 B2 | 11/2002 | Yamazaki et al. | ............ | 438/710 |
| 6,537,918 B2 | 3/2003 | Ionov et al. | ............... | 438/710 |
| 6,559,001 B2 | 5/2003 | Athavale et al. | ............. | 438/243 |
| 6,576,507 B1 | 6/2003 | Bandy et al. | ............... | 438/234 |
| 6,613,682 B1 | 9/2003 | Jain et al. | ............... | 438/706 |
| 6,632,718 B1 | 10/2003 | Grider et al. | ............... | 438/305 |
| 6,670,233 B2 | 12/2003 | Athavale et al. | ............ | 438/243 |
| 6,828,187 B1 * | 12/2004 | Liu et al. | ............... | 438/232 |
| 7,109,085 B2 * | 9/2006 | Wang et al. | ............... | 438/279 |

(Continued)

FOREIGN PATENT DOCUMENTS

EP 200951 A2 * 11/1986

(Continued)

OTHER PUBLICATIONS

Vallon, S. et al "Polysilicon-germanium gate patterning studies in a high density plasma helicon source" JVST A 15(4) 1874-80, Jul. 1997.*

(Continued)

*Primary Examiner*—Anita K Alanko
(74) *Attorney, Agent, or Firm*—Beyer Law Group LLP

(57) ABSTRACT

A method for etching a stack with at least one silicon germanium layer over a substrate in a processing chamber is provided. A silicon germanium etch is provided. An etchant gas is provided into the processing chamber, wherein the etchant gas comprises HBr, an inert diluent, and at least one of $O_2$ and $N_2$. The substrate is cooled to a temperature below 40° C. The etching gas is transformed to a plasma to etch the silicon germanium layer.

14 Claims, 6 Drawing Sheets

U.S. PATENT DOCUMENTS

| | | | |
|---|---|---|---|
| 7,319,074 B2 * | 1/2008 | Chou et al. | 438/717 |
| 2001/0051413 A1 * | 12/2001 | Chantre et al. | 438/364 |
| 2002/0016078 A1 | 2/2002 | Ionov et al. | 438/710 |
| 2002/0192900 A1 | 12/2002 | Athavale et al. | 438/243 |
| 2003/0003752 A1 | 1/2003 | Deshmukh et al. | |
| 2003/0143803 A1 | 7/2003 | Athavale et al. | 438/243 |
| 2003/0186492 A1 | 10/2003 | Brown et al. | |
| 2003/0227055 A1 | 12/2003 | Bae et al. | |
| 2004/0018739 A1 | 1/2004 | Abooameri et al. | |
| 2004/0033692 A1 | 2/2004 | Yamazaki et al. | |
| 2004/0067631 A1 * | 4/2004 | Bu et al. | 438/592 |
| 2004/0152331 A1 * | 8/2004 | Xu et al. | 438/719 |
| 2005/0037608 A1 * | 2/2005 | Andricacos et al. | 438/637 |

FOREIGN PATENT DOCUMENTS

| | | |
|---|---|---|
| EP | 0 200 951 | 12/1986 |
| JP | S63-13334 | 1/1988 |
| WO | WO 98/13880 | 4/1998 |
| WO | WO 98/13880 A1 | 4/1998 |
| WO | WO 00/04213 | 1/2000 |
| WO | WO 00/04213 A1 | 1/2000 |

OTHER PUBLICATIONS

Kim, S.-J. et al "Notch- and Foot-Free Dual Polysilicon Gate Etch" Electrochem. Soc. Proc. vol. 99-9, 361-5, 1999 (no month available).*

Kim, S. J. et al., "Notch- and foot-free dual polysilicon gate etch", Electrochemical Processing in ULSI Fabrication and Semiconductor/Metal Deposition II, Proceedings of the International Symposium (Electrochemical Society Proceedings vol. 99-9), Electrochem. Soc., Pennington, NJ, USA, 1999, pp. 361-365.

Vallon S. et al., "Poly-silicon-germanium gate patterning studies in a high density plasma helicon source", Journal of Vacuum Science & Technology A (Vacuum, Surfaces, and Films), AIP for American Vacuum Soc. USA, vol. 15, No. 4, Jul. 1997, pp. 1874-1880.

Wang, C. S. et al., "Reactive ion etching of $Si_{1-x}Ge_x$ alloy with hydrogen bromide", First International SiGe Technology and Device Meeting (ISTDM 2003) from Materials and Process Technology to Device and Circuit Technology, Jan. 15-17, 2003, Nagoya, Japan, vol. 224, No. 1-4, Mar. 15, 2004, pp. 222-226.

International Search Report, dated Oct. 25, 2005.

Austrian Search Report dated Jun. 12, 2008 from Singapore Patent Application No. 200606375-4.

Austrian Written Opinion dated Jun. 12, 2008 from Singapore Patent Application No. 200606375-4.

Search Report dated Jan. 19, 2009 from Singapore Patent Application No. 200606375-4.

* cited by examiner

US 7,682,985 B2

DUAL DOPED POLYSILICON AND SILICON GERMANIUM ETCH

BACKGROUND OF THE INVENTION

1. Field of the Invention

The invention relates to semiconductor devices. More specifically, the invention relates to semiconductor devices with a doped polysilicon and silicon germanium stack.

2. Description of the Related Art

The formation of film stacks of doped and undoped regions of polysilicon and silicon germanium (SiGe) are used for forming gate electrodes for semiconductor devices.

SUMMARY OF THE INVENTION

To achieve the foregoing and in accordance with the purpose of the present invention, a method for etching a stack with at least one silicon germanium layer over a substrate in a processing chamber is provided. A silicon germanium etch is provided. An etchant gas is provided into the processing chamber, wherein the etchant gas comprises HBr, an inert diluent, and at least one of $O_2$ and $N_2$. The substrate is cooled to a temperature below 40° C. The etching gas is transformed to a plasma to etch the silicon germanium layer.

In another manifestation of the invention a method for etching a polysilicon layer over a substrate, wherein the polysilicon layer has at least one doped region, is provided. The substrate is placed in a processing chamber. An etchant gas is provided into the processing chamber, wherein the etchant gas comprises $N_2$, $SF_6$, and at least one of $CHF_3$ and $CH_2F_2$. The etching gas is transformed to a plasma to etch the polysilicon layer.

In another manifestation of the invention, an apparatus for etching a stack with at least one silicon germanium layer over a substrate is provided. The apparatus comprises a processing chamber, a gas source, an energizing source, a temperature control device for controlling the temperature of the substrate, and a controller. The controller comprises, computer readable media comprising computer readable code for providing an etchant gas from the gas source into the processing chamber, wherein the etchant gas comprises HBr, an inert diluent, and at least one of $O_2$ and $N_2$, computer readable code for cooling the substrate to a temperature below 40° C., and computer readable code for using the energizing source to transform the etching gas to a plasma to etch the silicon germanium layer.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
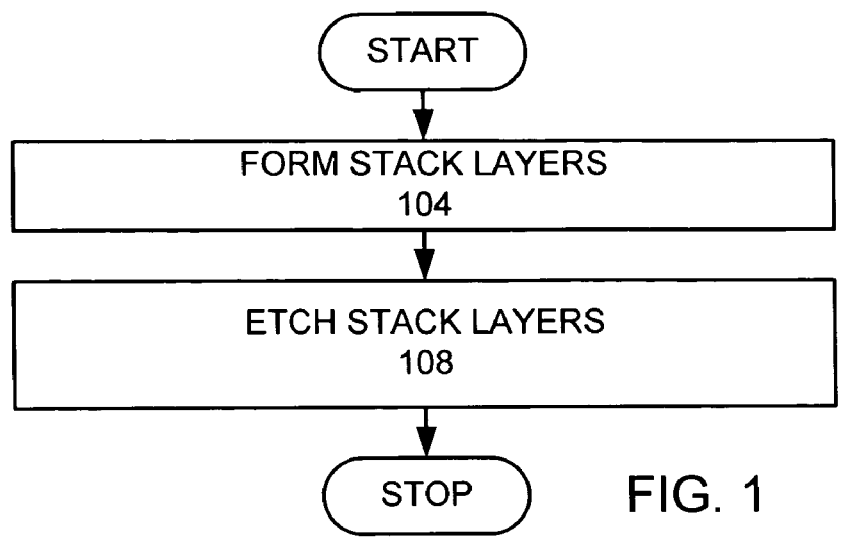
FIG. 1 is a high level flow chart for forming an etched stack that may be used for a gate electrode.
Figure 2:
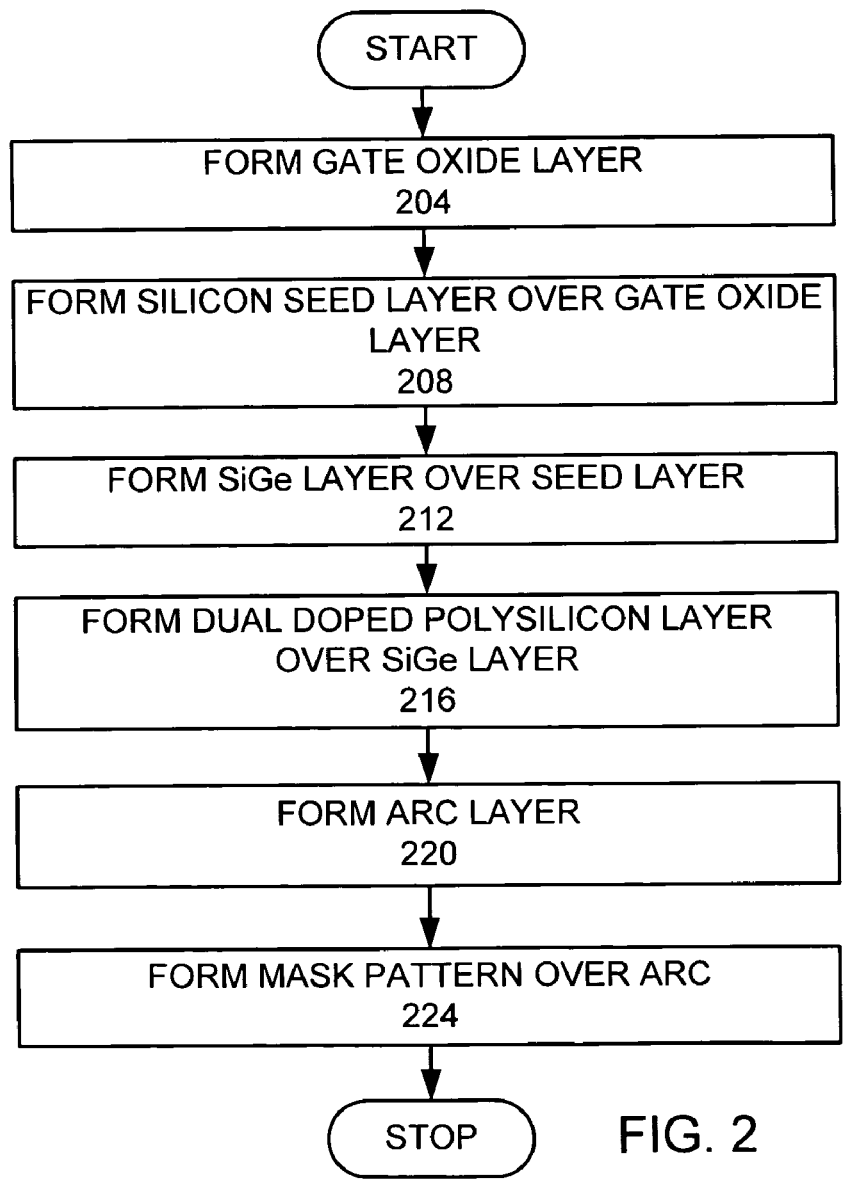
FIG. 2 is a more detailed flow chart of the formation of a stack of layers.
Figure 3A:
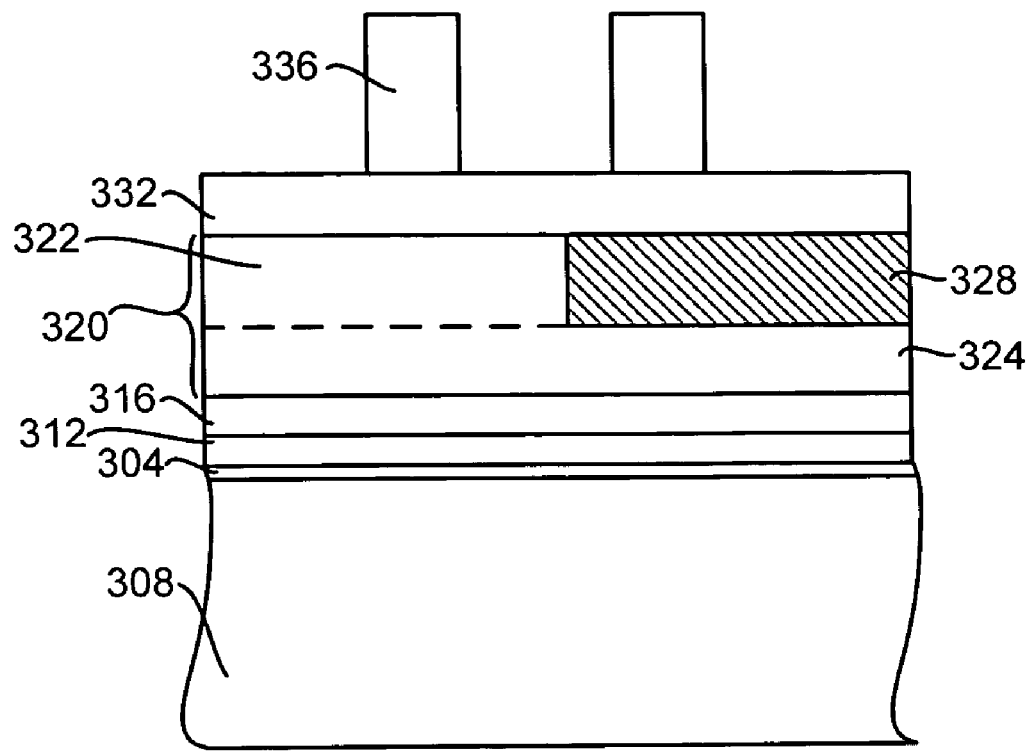
FIGS. 3A-3B are schematic a cross-sectional views of a film stack with a gate oxide layer 304 formed over a substrate.
Figure 3B:
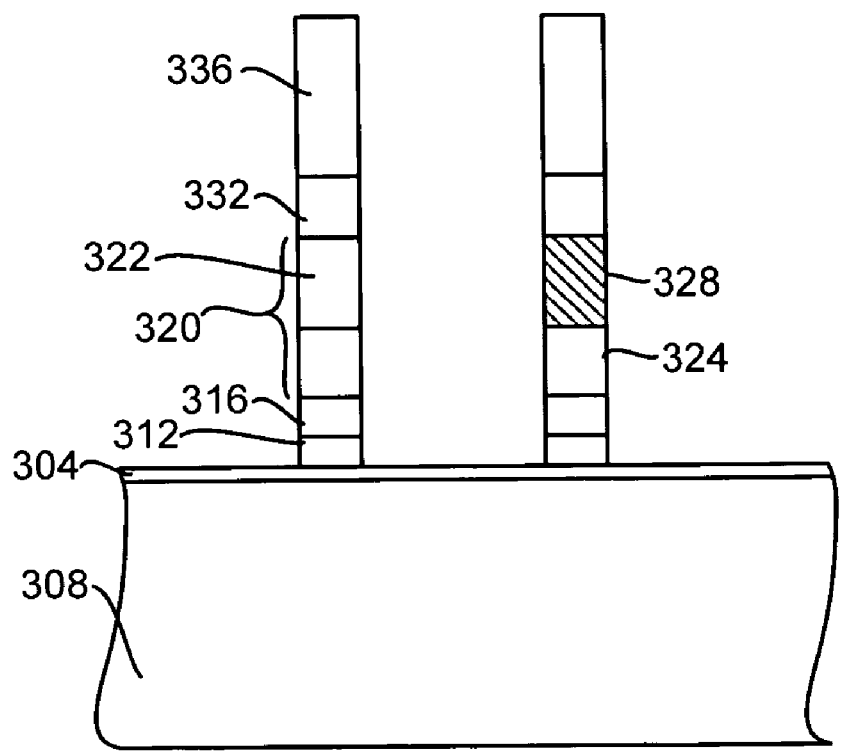

To facilitate understanding, FIG. 1 is a high level flow chart for forming an etched film stack that may be used for a gate electrode. A stack of layers is formed (step 104). The stack of layers is etched (step 108). FIG. 2 is a more detailed flow chart of the formation of a stack of layers (step 104). A gate oxide layer is formed (step 204). FIG. 3A is a cross-sectional view of a film stack with a gate oxide layer 304 formed over a substrate 308. A silicon seed layer 312 is formed over the gate oxide layer 304 (step 208). A silicon germanium (SiGe) layer 316 is formed over the gate oxide layer 304 (step 212). A polysilicon layer 320 is formed over the SiGe layer 316 (step 216). The polysilicon layer 320 comprises dual doped layer and an undoped layer 324. The dual doped layer comprises doped regions 328 and undoped regions 322. Various configurations of doped regions and undoped regions may be used. Generally, the most heavily doped regions of the polysilicon layer 320 may be near the top of the doped regions 328 forming a gradient from the top with the most heavily doped regions to the bottom of the polysilicon layer with the least doped or undoped regions. The heavily doped region is at the top of the polysilicon layer. The doping level decreases at higher depth and eventually the polysilicon becomes undoped at higher depth. An antireflective coating (ARC) layer 332, such as a bottom antireflective coating (BARC) layer, is placed over the dual doped polysilicon layer 320 (step 220). A photoresist mask 336 is formed over the ARC layer 332 (step 224).

In one example of a stack, the gate oxide layer 304 may be about 1.5 nm thick. The silicon seed layer 312 may be about 10 nm thick. The SiGe layer 316 may be about 20 nm thick. The dual doped polysilicon layer 320 may be about 100 nm thick. A most heavily doped region 328 of the dual doped polysilicon layer 320 may have a depth of 50-70 nm. The ARC layer 332 may be about 100 nm thick. The 193 nm photoresist mask may be about 190 nm thick.

The etching of such a stack has had an added difficulty in that the etching characteristics of doped polysilicon regions is different than the characteristics of etching undoped polysilicon regions. As a result, an etch process that may provide a vertical etch profile for undoped polysilicon regions may provide undercutting in doped polysilicon regions. In another example, an etch that may provide a vertical etch profile for doped polysilicon regions may provide tapered profile or footers for undoped polysilicon regions.

The SiGe layer 316 under the dual doped polysilicon layer 320 has different etch properties than the dual doped polysilicon layer 320. The different etch properties of the SiGe layer 316 and the thinness of the SiGe layer 316 and the silicon seed layer 312 add additional etching difficulties. In such difficulties, an etch process that may provide a vertical etch of the dual doped polysicon layer 320 may cause under cutting in the SiGe layer 316 or the formation of footers in the silicon seed layer 312. Part of the reason for the difficulty caused by the thinness of the SiGe layer and seed layer, is that it is more difficult to have a separate etch step for such thin layers. A single etch step is used to etch both the SiGe and seed silicon layers. A vertical etch is important and even more important near the bottom of the stack, because the dimensions near the bottom of the stack help to define the gate length. Therefore undercutting or the formation of a foot will change the gate length.

In addition, the photoresist is preferably a 193 nm or later generation resist, which is softer than the older generation resists. The inventive etch must therefore be more selective and also provide some passivation to protect the photoresist etch mask without providing too much passivation, which would cause etch stop.

Figure 4:
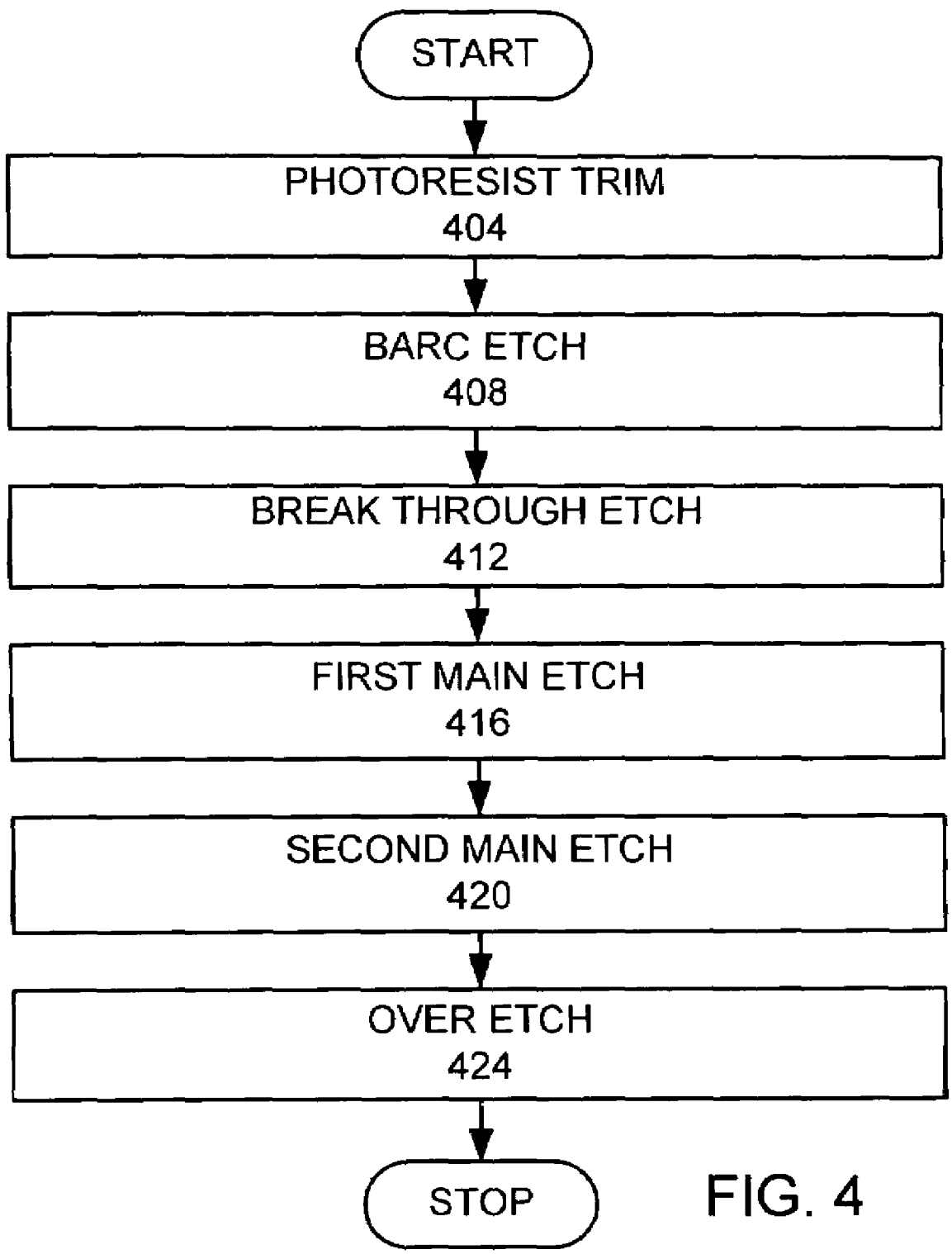
FIG. 4 is a more detailed flow chart of the etching of the stack of layers.

FIG. 4 is a more detailed flow chart of the step of etching of the stack of layers (step 108). The photoresist mask is trimmed (step 404). A novel trimming process, as described below, may be used here to reduce the critical dimensions of the photoresist mask. The ARC layer, which in this embodiment is BARC, is etched (step 408). A conventional BARC etching process may be used here to etch through the BARC layer.

Next a break through etch is used to etch through at least part of the dual doped regions formed by the undoped region 322 and the doped region 328 of the polysicon layer 320 (step 412). The undoped regions 322 and doped regions 328 at the top of the polysicon layer are etched at the same time. In this embodiment, the break through etch provides an etchant gas comprising $N_2$, $SF_6$, and at least one of $CHF_3$ and $CH_2F_2$. The etchant gas is transformed to a plasma, which is used to etch through the doped regions 328 and the undoped regions 322 of the polysicon layer 320. Although a breakthrough etch may mean an etch through a native oxide formed on the polysicon, the break through etch used in this step is used to both etch through native oxide formed on the dual doped polysicon and the most heavily doped region of the dual doped polysicon layer. The inventive break through etch provides minimal doped/undoped profile loading results, so that doped and undoped regions are etched with the same etch characteristics, so that both doped and undoped profiles look similar.

The break through etch is followed by a first main etch, which is used to etch through the undoped polysicon layer 324 (step 416). In this embodiment, the first main etch through the undoped polysicon layer uses an etchant gas comprising at least one of $Cl_2$, HBr, $O_2$, and $CF_4$. This etch step may be used to etch a feature to the SiGe layer 316. It has been found that this etch process has a low selectivity to gate oxide, so it is desirable to stop the break through etch before the etch feature reaches the gate oxide. An interferometer endpoint may be used to etch the feature to a distance of about 40 nm from the gate oxide layer 304. Also, an optical emission endpoint can be used to stop the etch at the polysilicon/SiGe interface.

The first main etch is then followed by a second main etch (step 420) with a higher selectivity to the etch stop, which is the gate oxide layer. In this embodiment, the second main etch uses an etchant gas of HBr and $O_2$. The second main etch is used to highly selectively etch the polysilicon layer, the SiGe layer, and the silicon seed layer.

After the second main etch has reached the etch stop an over etch step is performed (step 424) to complete the etching of the SiGe layer and the silicon seed layer. Therefore, in this embodiment the SiGe etch is used as a polysilicon over etch step to complete the etch of the polysilicon layer 320, the SiGe layer and the silicon seed layer. In this embodiment the etch of the SiGe layer and the silicon seed layer uses an etchant gas of HBr, He and $O_2$. This over etch is used to complete the etch and clean up residues. It has been found that by performing this etch at a temperature of less than 40° C. provides the unexpected result of providing a vertical etch profile without undercutting, bowing, or the forming of a foot for both the SiGe and silicon seed layers.

Experiments were carried out over a period of several months to attempt to find a process that would provide a vertical etch profile when etching the dual doped polysilicon layer, the SiGe layer and the seed layer. None of the attempted etch processes were found to provide the desired results, until an experiment using a lower process temperature of less than 40° C. was used during the SiGe etch unexpectedly provided the desired profile without undercutting, bowing, or the formation of a foot.

Generally, each etch step may be provided with an over etch step. If an etch monitor is used to determine when an endpoint is reached, an over etch step may be used to provide additional etching for a time to etch a determined amount past the end point.

EXAMPLE 1

In an example of the invention, a layered stack is formed. The layered stack may be formed using the steps described in FIG. 2 to form the layer stack as shown in FIG. 3A. In this example, the gate oxide layer 304 is 1.5 nm thick. The silicon seed layer 312 is 10 nm thick. The SiGe layer 316 is 20 nm thick. The dual doped polysilicon layer is 100 nm thick. The ARC layer 332 is 100 nm thick. The 193 photoresist mask 336 is 190 nm thick. The substrate 308 is then placed in a processing chamber.

Figure 5:
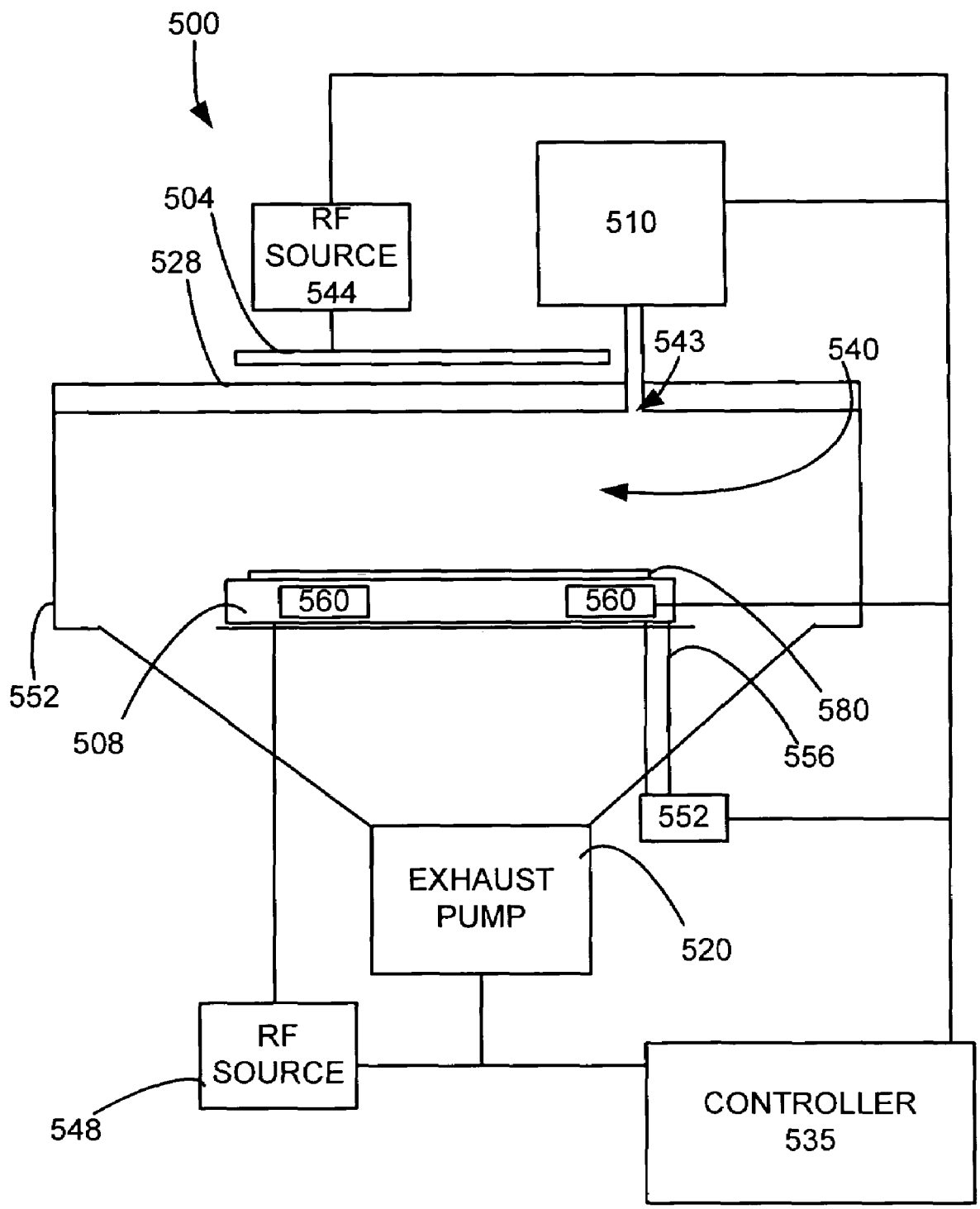
FIG. 5 is a schematic view of a process chamber that may be used in the preferred embodiment of the invention.

FIG. 5 is a schematic view of a process chamber 500 that may be used in the preferred embodiment of the invention. In this example, the processing chamber comprises a 2300 Versys Silicon by Lam Research Corporation of Fremont, Calif. The plasma processing chamber 500 may comprise an inductive coil 504, a lower electrode 508, a gas source 510, and an exhaust pump 520. Within plasma processing chamber 500, the substrate 308 is positioned upon the lower electrode 508. The lower electrode 508 incorporates a suitable substrate chucking mechanism (e.g., electrostatic, mechanical clamping, or the like) for supporting the substrate 308. The reactor top 528 incorporates a dielectric window. The chamber top 528, chamber walls 552, and lower electrode 508 define a confined plasma volume 540. Gas is supplied to the confined plasma volume by gas source 510 through a gas inlet 543 and is exhausted from the confined plasma volume by the exhaust pump 520. The exhaust pump 520 forms a gas outlet for the plasma processing chamber. A first RF source 544 is electrically connected to the coil 504. A second RF source 548 is electrically connected to the lower electrode 508. In this embodiment, the first and second RF sources 544, 548 comprise a 13.56 MHz power source. Different combinations of connecting RF power to the electrodes are possible. A controller 535 is controllably connected to the first RF source 544, the second RF source 548, the exhaust pump 520, and the gas source 510. A substrate cooling system comprises a chiller 552 that chills a coolant and a fluid delivery device 556 that passes the coolant from the chiller 552 to the and through the lower electrode 508 (electrostatic chuck) and then back to the chiller 552. The cooled lower electrode 508 cools the substrate. In addition, heaters 560 are provided and positioned inside the lower electrode to heat the substrate 580.

The heaters 560 and substrate cooling system and controller 535 are able to control temperature sufficiently to provide different substrate temperatures at different steps, as provided in the following examples.

Figure 6A:
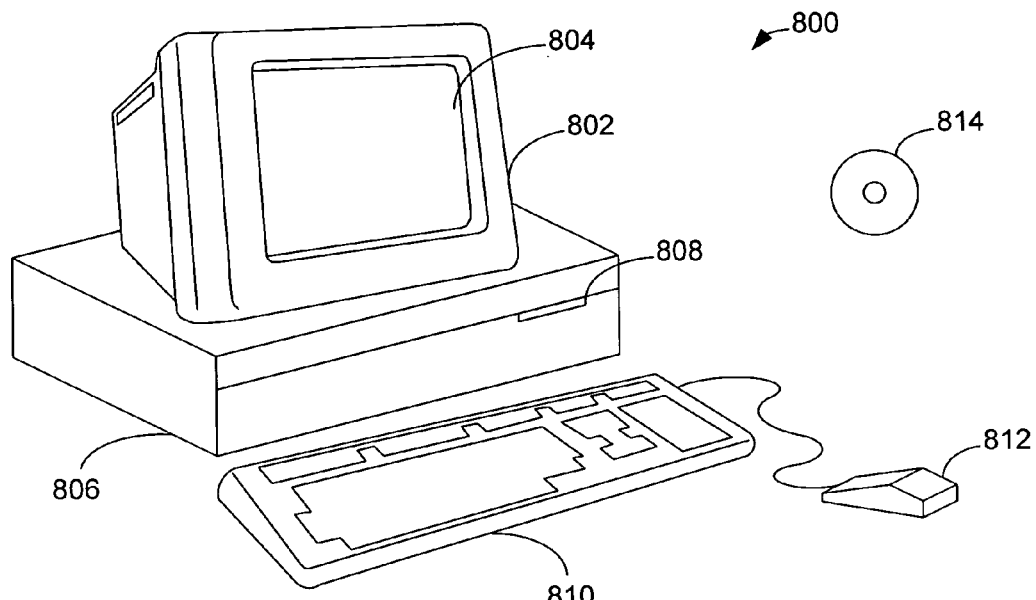
FIGS. 6A and 6B illustrate a computer system, which is suitable for implementing a controller.
Figure 6B:
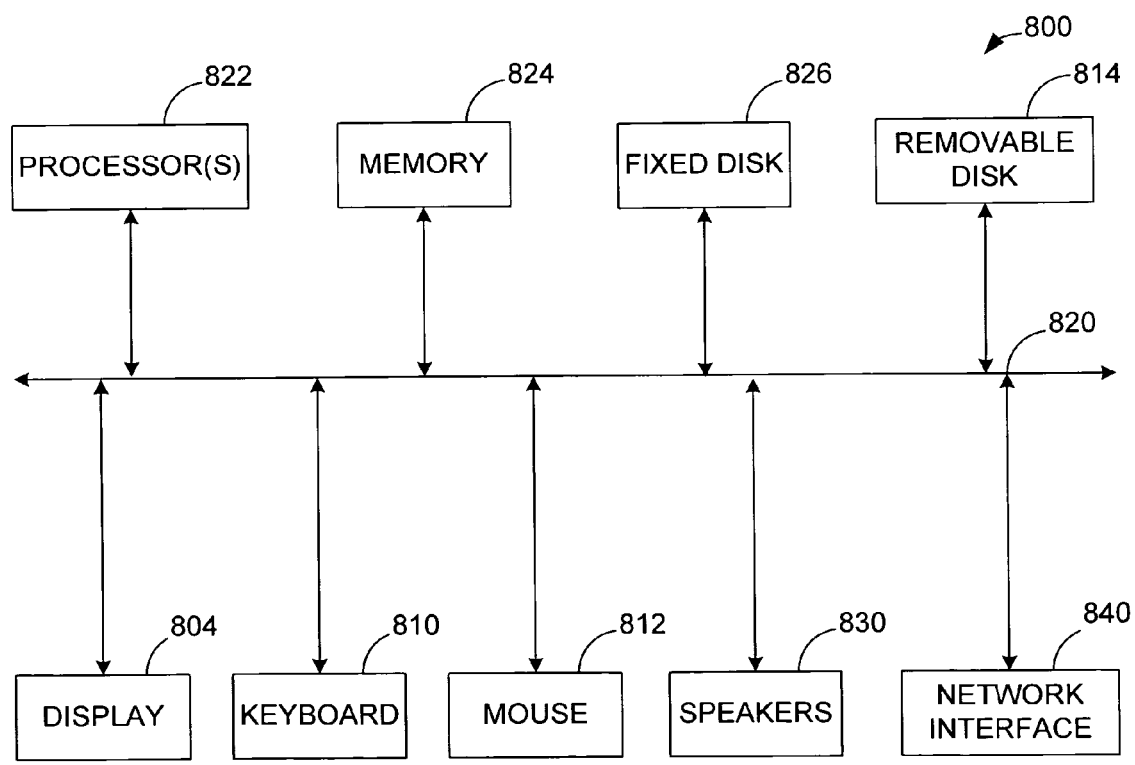

FIGS. 6A and 6B illustrate a computer system 800, which is suitable for implementing a controller 535 used in embodiments of the present invention. FIG. 6A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 6B is an example of a block diagram for computer system 800. Attached to system bus 820 is a wide variety of subsystems. Processor(s) 822 (also referred to as central processing units or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 is also coupled to a variety of input/output devices, such as display 804, keyboard 810, mouse 812 and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The photoresist trim may be accomplished within the process chamber 500 or before the substrate is placed within the process chamber 500. In a preferred embodiment of the trim process (step 404) HBr, $O_2$, and $CHF_3$ are provided for trimming the photoresist within the process chamber. In this example, the trim gas is 30 sccm HBr, 30 sccm $O_2$, and 40 sccm $CHF_3$. The pressure in the process chamber is 5 mTorr. The TCP power supplied to the process chamber is 250 Watts. The bias voltage is 70 volts. A helium backside pressure of 8 Torr is provided at the electrostatic chuck. An electrostatic chuck temperature of 60° C. was provided. This step was maintained for 44 seconds. This preferred embodiment provides an improved photoresist trim.

The BARC layer is then opened. A conventional BARC opening step may be used. The BARC etch may be accomplished within the process chamber 500 or before the substrate is placed within the process chamber 500. Such a BARC open process (step 408) may use $Cl_2$, $O_2$, and He for the BARC etching.

For the break through step (step 412), an etchant gas comprising $N_2$, $SF_6$, and at least one of $CHF_3$, and $CH_2F_2$ is provided. In this example, the etchant gas is 100 sccm $CHF_3$, 50 sccm $N_2$, and 20 sccm $SF_6$. The pressure in the process chamber is 5 mTorr. The TCP power supplied to the process chamber is 275 Watts. The bias voltage is 135 volts. A helium backside pressure of 8 Torr is provided at the electrostatic chuck. An electrostatic chuck temperature of 60° C. was provided. This step was maintained for 23 seconds.

For the first main etch step (step 416) an etchant gas comprising at least one of $Cl_2$, HBr, $O_2$, and $CF_4$ is provided. In this example, the etchant gas is 50 sccm $Cl_2$, 250 sccm HBr, 50 sccm $CF_4$, and 5 sccm $O_2$. The pressure in the process chamber is 10 mTorr. The TCP power supplied to the process chamber is 600 Watts. The bias voltage is 125 volts. A helium backside pressure of 8 Torr is provided. An electrostatic chuck temperature of 60° C. was provided. This step was maintained for 17 seconds.

For the second main etch step (step 420) an etchant gas comprising HBr, an inert diluent, and at least one of $O_2$ and $N_2$ is provided. In this example, the etchant gas is 180 sccm HBr and 5 sccm $O_2$. The pressure in the process chamber is 6 mTorr. The TCP power supplied to the process chamber is 350 Watts. The bias voltage is 65 volts. A helium backside pressure of 8 Torr is provided. An electrostatic chuck temperature of 60° C. was provided. This step was maintained for 14 seconds.

For the over etch step (step 424), which is also a SiGe etch, an etchant gas comprising HBr, an inert diluent, and at least one of $O_2$ and $N_2$ is provided. In this example, the etchant gas is 133 sccm HBr and 2 sccm $O_2$. The pressure in the process chamber is 80 mTorr. The TCP power supplied to the process chamber is 500 Watts. The bias voltage is 210 volts. A helium backside pressure of 8 Torr is provided. An electrostatic chuck temperature of 30° C. was provided. This step was maintained for 72 seconds. Because of the low processing temperature, the SiGe etch step is very robust and is able to extend the step time without lateral attack of the SiGe layer. An inert gas such as helium may also be added to the etchant gas. In this example, 267 sccm He is added. The heater and cooler in the inventive apparatus is able to provide desired temperature control, which is able to change the substrate temperature from 60° C. to 30° C. between steps. The heater and cooler provide the ability to quickly change temperatures.

This example has been found to provide uniform etching across a wafer.

OTHER EXAMPLES

Table 1 provides preferred, more preferred, and most preferred ranges for the break through etch.

TABLE 1

|  | Preferred Range | More Preferred | Most Preferred |
| --- | --- | --- | --- |
| $N_2$ | 20-100 sccm | 25-75 sccm | 40-60 sccm |
| $SF_6$ | 5-50 sccm | 10-30 sccm | 15-25 sccm |
| $CHF_3$ | 30-200 sccm | 50-150 sccm | 75-125 sccm |
| TCP | 100-1000 Watts | 150-600 Watts | 200-400 Watts |
| Bias Voltage | 25-200 Volts | 50-175 Volts | 100-150 Volts |
| Pressure | 1-40 mTorr | 3-20 mTorr | 5-10 mTorr |
| Flow ratio $CHF_3$:$SF_6$ | 50:1-2:1 | 20:1-3:1 | 10:1-3:1 |
| Flow ratio $CHF_3$:$N_2$ | 5:1-1:1 | 4:1-1:1 | 3:1-2:1 |
| Temperature | 10-90° C. | 25-80° C. | 30-60° C. |

Table 2 provides preferred, more preferred, and most preferred ranges for the first main etch.

TABLE 2

|  | Preferred Range | More Preferred | Most Preferred |
| --- | --- | --- | --- |
| $Cl_2$ | 20-100 sccm | 25-75 sccm | 40-60 sccm |
| $CF_4$ | 10-100 sccm | 30-70 sccm | 40-60 sccm |
| HBr | 100-500 sccm | 150-400 sccm | 200-300 sccm |
| $O_2$ | 1-20 sccm | 2-15 sccm | 3-10 sccm |
| TCP | 100-1000 Watts | 300-800 Watts | 500-700 Watts |
| Bias Voltage | 50-200 Volts | 100-150 Volts | 115-135 Volts |
| Pressure | 1-40 mTorr | 3-20 mTorr | 5-15 mTorr |
| Flow ratio HBr:$CF_4$ | 10:1-2:1 | 8:1-3:1 | 6:1-4:1 |
| Flow ratio HBr:$O_2$ | 100:1-10:1 | 80:1-20:1 | 60:1-40:1 |
| Flow ratio HBr:$Cl_2$ | 10:1-2:1 | 8:1-3:1 | 6:1-4:1 |
| Temperature | 10-90° C. | 25-70° C. | 30-60° C. |

Table 3 provides preferred, more preferred, and most preferred ranges for the second main etch.

TABLE 3

|  | Preferred Range | More Preferred | Most Preferred |
| --- | --- | --- | --- |
| $O_2$ | 1-20 sccm | 2-15 sccm | 3-10 sccm |
| HBr | 100-400 sccm | 150-300 sccm | 160-200 sccm |
| TCP | 100-600 Watts | 200-500 Watts | 300-400 Watts |
| Bias Voltage | 20-110 Volts | 40-100 Volts | 60-90 Volts |
| Pressure | 1-20 mTorr | 3-15 mTorr | 5-10 mTorr |
| Flow ratio HBr:$O_2$ | 100:1-10:1 | 80:1-20:1 | 50:1-30:1 |
| Temperature | 10-90° C. | 15-70° C. | 20-60° C. |

If $N_2$ is used in place of $O_2$, $N_2$ would have the same flow rates and flow ratios as $O_2$ in the above example. Also, nitrogen can be used in addition to oxygen at same amounts.

Table 4 provides preferred, more preferred, and most preferred ranges for the over etch of the polysilicon, which etches the SiGe and silicon seed layers (the SiGe etch).

TABLE 4

|  | Preferred Range | More Preferred | Most Preferred |
| --- | --- | --- | --- |
| $O_2$ | 0.5-20 sccm | 1-10 sccm | 1-5 sccm |
| HBr | 80-300 sccm | 100-200 sccm | 120-150 sccm |
| TCP | 100-1000 Watts | 200-750 Watts | 400-600 Watts |
| Bias Voltage | 100-400 Volts | 150-300 Volts | 180-250 Volts |
| Pressure | 20-100 mTorr | 40-90 mTorr | 60-80 mTorr |
| Flow ratio HBr:$O_2$ | 200:1-10:1 | 100:1-20:1 | 80:1-30:1 |
| Temperature | 0-40° C. | 10-35° C. | 20-30° C. |

If $N_2$ is used in place of $O_2$, $N_2$ would have the same flow rates and flow ratios as $O_2$ in the above example. Also, nitrogen can be used in addition to oxygen at same amounts.

In the above examples, the etch gases consist essentially of the component gases specified. In other embodiments, other or additional component gases may be used.

In another example break through recipes with a pressure of 5 mTorr, TCP power of 300 Watts, 53 volts of bias, a chuck temperature of 60° C. was able to use a break through gas mixture of $CH_2F_2$, $SF_6$, and $N_2$. In one example, the break through gas mixture comprised 30 sccm $CH_2F_2$, 20 sccm $SF_6$, and 50 sccm $N_2$, which was maintained for 37 seconds. In another example, the break through gas mixture comprised 40 sccm $CH_2F_2$, 20 sccm $SF_6$, and 50 sccm $N_2$, which was maintained for 52 seconds. Although these recipes provided good results, it was found that the process window when using $CH_2F_2$ appeared to be smaller than the process window when using $CH_3F$. It has been found that increasing the TCP power to at least 600 Watts helps reduce necking.

Through experimentation at 60° C., it has been found that lowering the HBr/He ratio during the SiGe etch decreases the SiGe layer bowing, but also may cause a small foot in the silicon seed layer. It has also been found that extending the SiGe etch step increases the SiGe profile bowing.

It has been found that lowering the substrate temperature below 40° C., preferably to about 30° C., during the SiGe etch step results in an etch where the seed silicon, the polysilicon, and the SiGe layers each have about the same etch characteristics. The lowering of the substrate temperature provides a very robust process, where slight changes in the parameters do not significantly increase under cutting or bowing, or the formation of footers. Therefore the reduced temperature during the SiGe etch allows for some variation of process parameters without affecting the vertical profile of the etched features. The maintaining of the substrate at 30° C. may be accomplished by having the chiller 552 cool the cooling liquid to 20° C. The cooling liquid is passed through the lower electrode 508 to cool the lower electrode to 20° C., which cools the substrate 308 to 20° C. The heaters 560 are then used to heat the substrate to 30° C.

Other embodiments of the invention would replace the first main etch with the break through etch, thus extending the break through etch step and eliminating the first main etch.

Other embodiments may perform the second main etch at a temperature less than 40° C. to obtain more robust results. The inventive etch also provides sufficient passivation to prevent undercutting, without causing etch stopping. In another example a small amount of $Cl_2$ is provided during the second main etch to eliminate or reduce any foot that is formed during the second main etch.

It has also been found that the inventive etch provides reduced line edge roughness. It is believed that the invention allows for more passivation during the trim step, which reduces sidewall roughness.

Other embodiments of the invention may provide the inventive SiGe etch separately, instead of as a polysilicon over etch.

Figure 7A:
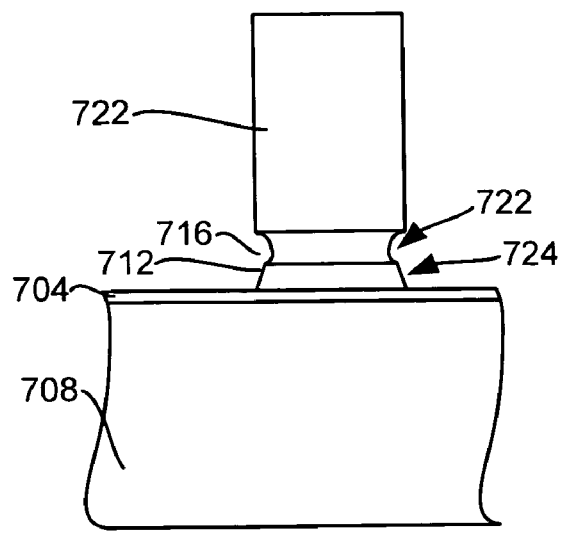
FIGS. 7A-D are schematic views of etched film stacks.
Figure 7B:
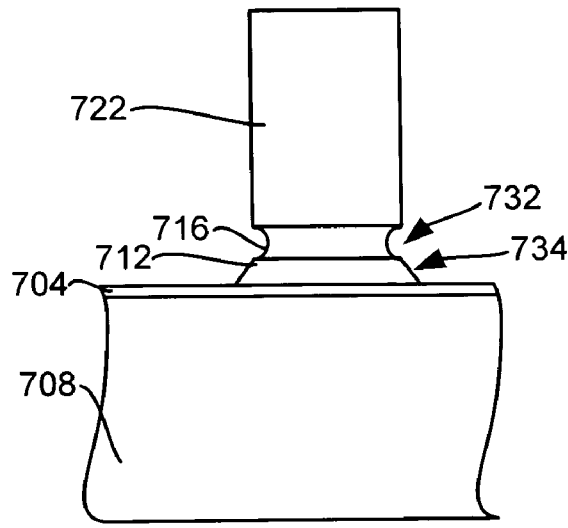
Figure 7C:
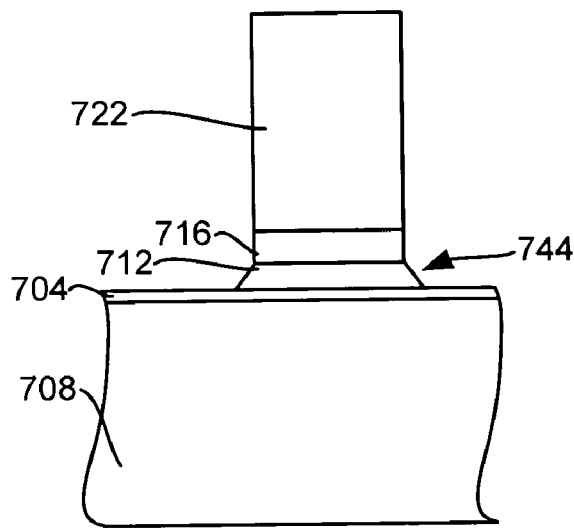
Figure 7D:
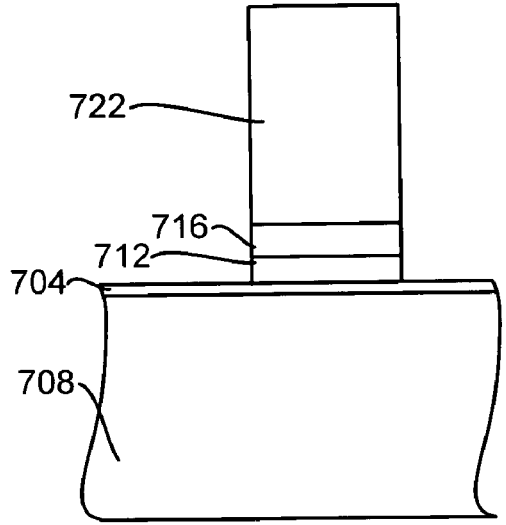

To facilitate understanding, FIGS. 7A-7D are schematic illustrations of various profiles etched using various processes, wherein FIGS. 7A-C are schematic illustrations of profiles etched using prior art processes and FIG. 7D is a schematic illustration of a profile etched using the invention. FIG. 7A is a schematic illustration of a stack over a gate oxide layer over a substrate 708, where the stack comprises a silicon seed layer 712, a SiGe layer 716, and a polysilicon layer 722, which has doped and undoped regions. The prior art etching process in this example creates a bowed SiGe portion 722 and a seed silicon foot 724. In this example the combination bow and foot does not create any CD gain. FIG. 7B is a schematic illustration of a stack with a prior art etching that creates a less bowed SiGe portion 732 and a larger seed silicon foot 734, where the combination bow and foot causes CD gain. FIG. 7C is a schematic illustration of a stack with a prior art etching that creates a vertical SiGe portion and a seed silicon foot 744, where the foot causes CD gain. FIG. 7D is a schematic illustration of a stack with an etching that uses the invention that creates a vertical SiGe layer and seed silicon etch.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method of etching a polysilicon layer over a substrate, wherein the polysilicon layer has at least one doped region and at least one undoped region, comprising:
    placing the substrate in a processing chamber;
    providing an etchant gas into the processing chamber, wherein the etchant gas comprises $N_2$, $SF_6$, and at least one of $CHF_3$ and $CH_2F_2$; and
    transforming the etching gas to a plasma to simultaneously etch the at least one doped region and at least one undoped region of the polysilicon layer; and directly thereafter
    providing a polysilicon main etch, comprising:
        providing an etchant gas with at least one of $Cl_2$, HBr, $CF_4$, and $O_2$; and
        transforming the etching gas to a plasma to etch the polysilicon layer.

2. The method, as recited in claim 1, further comprising providing a photoresist mask over the stack.

3. The method, as recited in claim 2, wherein the photoresist mask is of a 193 or higher generation photoresist.

4. A method for etching a stack with at least one silicon germanium layer over a substrate in a processing chamber and a polysilicon layer over the silicon germanium layer, wherein at least one region of the polysilicon layer is doped and at least one region of the polysilicon layer is undoped, comprising:
    providing a break through etch of the polysilicon layer over the silicon germanium layer, wherein the break through etch simultaneously etches the at least one doped region and the at least one undoped region of the polysilicon layer, comprising:
        providing an etchant gas into the processing chamber, wherein the etchant gas comprises $N_2$, $SF_6$, and at least one of $CHF_3$ and $CH_2F_2$; and
        transforming the etching gas to a plasma to simultaneously etch the at least one doped region and at least one undoped region of the polysilicon layer; directly thereafter
    providing a polysilicon main etch after the break through etch, comprising:
        providing an etchant gas with at least one of $Cl_2$, HBr, $CF_4$, and $O_2$; and
        transforming the etching gas to a plasma that etches the polysilicon layer completely through to the silicon germanium layer; and
    providing a silicon germanium etch after the polysilicon main etch, comprising:
        providing an etchant gas into the processing chamber, wherein the etchant gas comprises HBr, an inert diluent, and at least one of $O_2$ and $N_2$;
        cooling the substrate to a temperature below 40° C.; and
        transforming the etching gas to a plasma to etch the silicon germanium layer.

5. The method, as recited in claim 4, wherein the etching the silicon germanium layer and the polysilicon layer provides a vertical profile.

6. The method, as recited in claim 5, wherein the stack further comprises a seed silicon layer under the silicon germanium layer, wherein the SiGe etch etches through the seed silicon layer.

7. The method, as recited in claim 6, wherein combined thicknesses of the seed silicon layer and silicon germanium layer is between 10 and 50 nanometers.

8. The method, as recited in claim 7, further comprising providing a photoresist mask over the stack.

9. The method, as recited in claim 8, wherein the photoresist mask is of a 193 or higher generation photoresist.

10. The method, as recited in claim 4, wherein combined thicknesses of the seed silicon layer and silicon germanium layer is less than half a thickness of the polysilicon layer.

11. The method, as recited in claim 4, wherein the stack further comprises a seed silicon layer under the silicon germanium layer, wherein the SiGe etch etches through the seed silicon layer.

12. The method, as recited in claim 11, wherein combined thicknesses of the seed silicon layer and silicon germanium layer is between 10 and 50 nanometers.

13. The method, as recited in claim 4, further comprising providing a photoresist mask over the stack.

14. The method, as recited in claim 13, wherein the photoresist mask is of a 193 or higher generation photoresist.

* * * * *